United States Patent
Liao et al.

(10) Patent No.: US 12,025,919 B2
(45) Date of Patent: Jul. 2, 2024

(54) METHOD OF STORING PHOTORESIST COATED SUBSTRATES AND SEMICONDUCTOR SUBSTRATE CONTAINER ARRANGEMENT

(71) Applicant: TAIWAN SEMICONDUCTOR MANUFACTURING CO., LTD., Hsinchu (TW)

(72) Inventors: Chun-Wei Liao, Taoyuan (TW); Sheng-Wen Jiang, Hsinchu (TW); Jan-Liang Yang, Taichung (TW); Hui-Chun Lee, Hsinchu (TW)

( * ) Notice: Subject to any disclaimer, the term of this patent is extended or adjusted under 35 U.S.C. 154(b) by 613 days.

(21) Appl. No.: 16/697,136

(22) Filed: Nov. 26, 2019

(65) Prior Publication Data
US 2020/0174374 A1  Jun. 4, 2020

Related U.S. Application Data

(60) Provisional application No. 62/773,928, filed on Nov. 30, 2018.

(51) Int. Cl.
*G03F 7/38* (2006.01)
*G03F 7/16* (2006.01)

(52) U.S. Cl.
CPC ............... *G03F 7/38* (2013.01); *G03F 7/162* (2013.01)

(58) Field of Classification Search
CPC .............. G03F 7/11; G03F 7/168; G03F 7/38
See application file for complete search history.

(56) References Cited

U.S. PATENT DOCUMENTS

| 6,120,584 | A  | * | 9/2000 | Sakata ................... B01D 53/02 96/135 |
| 6,338,931 | B1 | * | 1/2002 | Maeda .................. G03F 7/0392 430/326 |
| 2002/0124906 | A1 | * | 9/2002 | Suzuki ............. H01L 21/67366 141/98 |
| 2006/0121359 | A1 | * | 6/2006 | Kobayashi ................ G03F 1/48 430/5 |
| 2011/0086313 | A1 | * | 4/2011 | Oori ...................... G03F 7/2022 430/312 |
| 2012/0208127 | A1 | * | 8/2012 | Hatakeyama ......... G03F 7/0043 430/296 |
| 2014/0272716 | A1 | * | 9/2014 | Lai ........................ G03F 7/2041 524/553 |

FOREIGN PATENT DOCUMENTS

JP  2002-268208  *  9/2002  ............. G03F 7/004

OTHER PUBLICATIONS

English Abstract Translation of JP 2002-268208 (Year: 2002).*

* cited by examiner

*Primary Examiner* — Daborah Chacko-Davis
(74) *Attorney, Agent, or Firm* — STUDEBAKER & BRACKETT PC

(57) ABSTRACT

A method for manufacturing a semiconductor device includes forming a forming a photoresist layer over a semiconductor substrate and selectively exposing the photoresist layer to actinic radiation. After selectively exposing the photoresist layer to actinic radiation, storing the semiconductor substrate in a semiconductor substrate container under an ambient of extreme dry clean air or inert gas. The method also includes after the storing the semiconductor substrate, performing a first heating of the photoresist layer.

20 Claims, 6 Drawing Sheets

METHOD OF STORING PHOTORESIST COATED SUBSTRATES AND SEMICONDUCTOR SUBSTRATE CONTAINER ARRANGEMENT

PRIORITY CLAIM AND CROSS-REFERENCE

This application claims priority to U.S. Provisional Application No. 62/773,928 filed on Nov. 30, 2018, entitled "METHOD OF STORING PHOTORESIST COATED SUBSTRATES AND STORAGE CONTAINER ARRANGEMENT," the entire disclosure of which is incorporated herein by reference.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size.

One enabling technology that is used in the manufacturing processes of semiconductor devices is the use of photosensitive materials. Such materials are applied to a surface and then exposed to an energy that has itself been patterned. Such an exposure modifies the chemical and physical properties of the exposed regions of the photosensitive material. This modification, along with the lack of modification in regions of the photosensitive that were not exposed, can be exploited to remove one region without removing the other.

As the semiconductor device sizes continue to shrink, for example below 20 nanometer (nm) nodes, traditional lithography technologies have optical restrictions, which leads to resolution issues and may not achieve the desired lithography performance. Extreme ultraviolet lithography (EUVL) has been developed to form smaller semiconductor device feature size and increase device density on a semiconductor wafer. Because metals have high extreme ultraviolet (EUV) absorbance, metal-containing photoresists have been developed to provide improved EUVL. Metal-containing photoresists, after being exposed, are susceptible to water absorption which may negatively affect the critical dimension of the photoresist patterns on a wafer, especially when there is a delay between a first time the wafer coated with metal-containing photoresist is exposed to EUV to create a pattern and a second time the post-exposure bake (PEB) is performed on the wafer. An efficient technique to prevent water contamination of metal-containing photoresists is desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figures 1A, 1B:
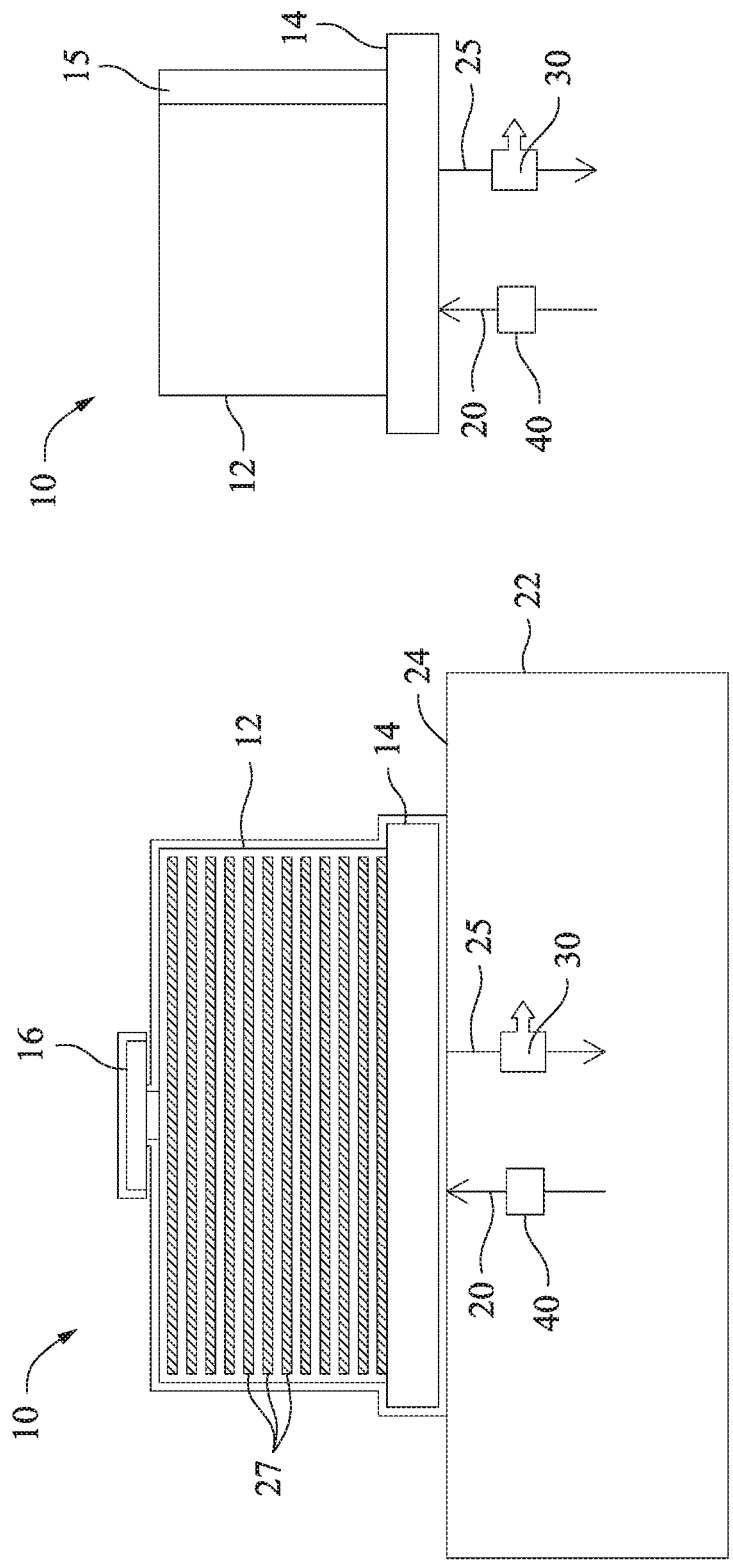
FIG. 1A illustrates a rear view of an exemplary semiconductor substrate container containing semiconductor wafers in accordance with some embodiments of the present disclosure.
FIG. 1B illustrates a side view of an exemplary semiconductor substrate container of a storage system in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

As the semiconductor device sizes continue to shrink, EUV radiation is used in an EUVL system to pattern the wafers. Metals show high EUV absorption and thus metal-containing photoresists have been developed to provide improved EUVL. However, the exposed metal-containing photoresists are susceptible to water vapor that may exist in the environment, e.g., in the air, and may interact with the exposed metal-containing photoresists, and deteriorate the exposed metal-containing photoresists in time. Thus, if a wafer covered with a metal-containing photoresists is exposed to EUV to project a layout onto the surface of the wafer and the wafer is kept in an environment containing water vapor, the exposed metal-containing photoresists may deteriorate and affect the critical dimension (CD) of the projected layout.

In some embodiments, the next process step after projecting a layout onto the surface of the wafer with EUV is the post-exposure bake. The exposed wafers having projected layouts on them may be stored inside a semiconductor substrate container, e.g., a FOUP, before being sent to the post-exposure bake operation. The FOUP with the exposed wafers may be stored for a storage time up to a few days, e.g., two days, before being sent to the post-exposure bake operation. In some embodiments, when water vapor exists in the FOUP the water vapor affects the CD of the projected layout on the wafers. In some embodiments, purging the water vapor from the FOUP environment after the exposed wafers are loaded in the FOUP and sealing the purged FOUP before storing the FOUP removes the water vapor from the FOUP environment and prevents the CD change of the exposed wafers in the FOUP due to storing the FOUP for up to at least a few days.

FIG. 1A illustrates a rear view of an exemplary semiconductor substrate container containing semiconductor wafers in accordance with some embodiments of the present disclosure. As shown in FIG. 1A, a storage system 10 includes a semiconductor substrate container 12 with a handle 16 and containing semiconductor wafers 27. The semiconductor substrate container 12 is supported on a surface 24 of a platform 22. In some embodiments, the platform 22 is a location for storing and/or sealing the semiconductor substrate container 12. When the platform 22 is the location for sealing the semiconductor substrate container 12, the storage system 10 includes a gas inlet 20 for introducing an extreme clean dry air or an inert gas into the semiconductor substrate container 12 and a gas outlet 25 for allowing gas, including extreme clean dry air, inert gas, or water vapor to exit the semiconductor substrate container 12 during a purging operation.

In some embodiments, an inert gas source or a source for extreme clean dry air is connected to the gas inlet 20. In some embodiments, a gas purifier 40 is connected in line with the gas inlet 20. In some embodiments, the gas purifier 40 that is connected to the gas inlet 20 is an automatically re-generable purifier, such as an Ambient Temp PS22 Automatically Re-generable Purifier manufactured by SAES Pure Gas. In some embodiments, the gas purifier is configured to provide a purified gas containing less than 1 ppb impurities and less than 1% relative humidity.

In some embodiments, a sensor 30 measures the humidity of gas passing through the gas outlet 25. In some embodiments, extreme clean dry air or inert gas flows into the semiconductor substrate container 12 through the lower portion 14 of the semiconductor substrate container 12 and the semiconductor substrate container 12 is purged until the relative humidity of the gas exiting the semiconductor substrate container 12 through the gas outlet 25 has a relative humidity below a threshold value as measured by the sensor 30. In some embodiments, the threshold value is in a range of relative humidity values between 0.1% and 1% relative humidity. When the relative humidity drops below the threshold value, the gas flow is shut off and the gas outlet 25 and the gas inlet 20 of the semiconductor substrate container 12 are sealed. In some embodiments, when the sealed semiconductor substrate container 12 is stored between process steps, the pressure of extreme clean dry air or inert gas in the semiconductor substrate container 12 is kept about 130 kPa. In some embodiments, the pressure inside the substrate container 12, e.g., the FOUP, after being sealed is about the same as the ambient pressure, e.g., the atmospheric pressure.

FIG. 1B illustrates a side view of an exemplary semiconductor substrate container of a storage system in accordance with some embodiments of the present disclosure. The storage system 10 includes the semiconductor substrate container 12 that may be a front opening unified pod (FOUP). The FOUP has a door 15, which is opened and closed to introduce or remove substrates (e.g., wafers) from the FOUP. In some embodiments, the door 15 may tightly seal the container and to prevent gas exchange to and from the semiconductor substrate container 12 via the door 15. As described, the storage system 10 also includes the gas inlet 20 for introducing extreme clean dry air or an inert gas into the semiconductor substrate container 12, and includes the gas outlet 25 that allows gas, including extreme clean dry air, inert gas, and water vapor to exit the semiconductor substrate container 12 during the purging operation. In some embodiments, when the relative humidity drops below the threshold value, the gas outlet 25, the gas inlet 20, and the door 15 of the semiconductor substrate container 12 are sealed.

Figure 2:
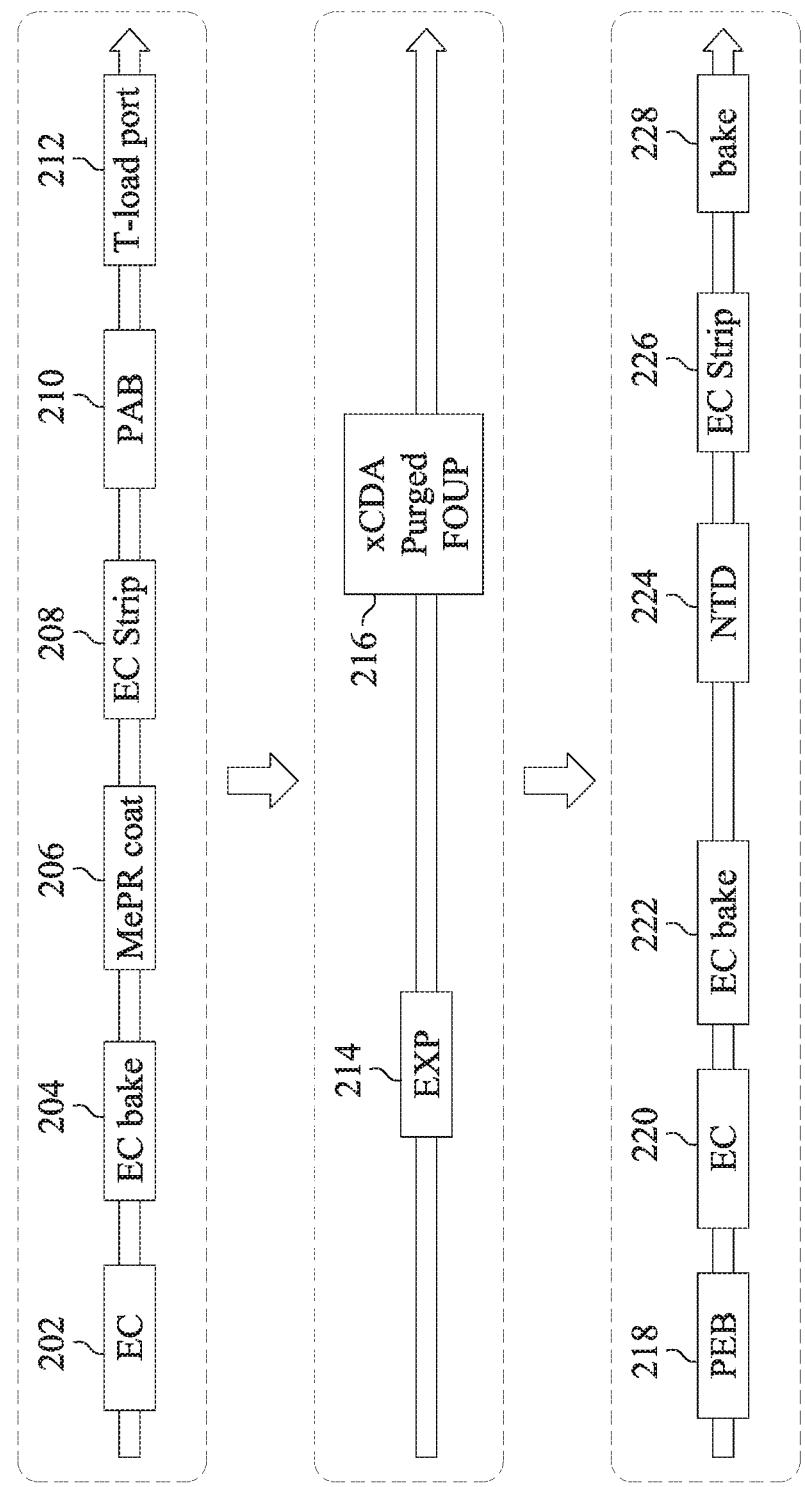
FIG. 2 illustrates a process flow for patterning wafers of a semiconductor substrate container in accordance with some embodiments of the present disclosure.

FIG. 2 illustrates a process flow for patterning wafers in accordance with some embodiment of the disclosure. In some embodiments, a semiconductor substrate, such as the wafer 27 of FIG. 1A, is coated around the edges with a protective composition in an EC (edge coating) operation 202. The protective composition may include a polymer with an acid-labile group (ALG) and a thermal acid generator (TAG) or a photo-acid generator (PAG) in a solvent. When the TAG or PAG is activated, an acid is released, which cleaves the ALG on the polymer that causes the polymer to cross-link and cure, e.g., harden. In some embodiments, the solvent of the protective composition is the propylene glycol methyl ether acetate (PGMEA). In some embodiments, the operation 202 protects the substrate edge and to prevent the metal-containing photoresist from spilling from the wafer edge and contaminating process locations that the wafer 27 is transferred to during the subsequent process steps. The protective composition is applied to edges of the semiconductor substrate in some embodiments to protect the edges, sides, and backside of the semiconductor substrate (e.g., wafer). The protective composition is baked in an edge coating (EC) bake operation 204 and then the metal-containing photoresist (MePR) is coated on a top surface of the semiconductor wafer 27 in a photoresist coating operation (MePR coat) 206. The metal-containing photoresist is described in more detail below. Following the application of metal-containing photoresist to the surface of wafer 27, the protective composition is removed in an EC stripping operation 208, and then the photoresist undergoes a post-application bake (PAB) operation 210, also known as a pre-exposure bake or soft bake to cure the metal-containing photoresist. In some embodiments, the pre-exposure bake is performed at a temperature varying from about 40° C. to about 120° C for about 10 seconds to about 10 minutes. In some embodiments, the photolithography tool is a laser scanner, in other embodiments, the photolithography tool is an extreme ultraviolet lithography (EUVL) tool. In some embodiments, the semiconductor substrate container 12 is transferred to a load port at T-load port operation 212 where the semiconductor substrate container 12 and the wafers in the semiconductor substrate container 12 are transferred to another process location. In some embodiments, the other process location is a process location for exposing the wafer 27 and performing lithography. In some embodiments, the pre-exposure bake is performed at a temperature varying from about 40° C. to about 120° C. for about 10 seconds to about 10 minutes.

Next, the metal-containing photoresist is selectively exposed to actinic radiation in the photolithography tool in an exposure (EXP) operation 214 to form a latent pattern in the photoresist layer, and then the wafer 27 having the exposed metal-containing photoresist is loaded into the semiconductor substrate container 12, e.g., a front opening unified pod (FOUP), and the FOUP is purged with an extreme clean dry air (xCDA) or inert gas in the xCDA Purged FOUP operation 216. As described, in some embodiments, the semiconductor substrate container 12 is a FOUP and the FOUP is sealed after the xCDA Purged FOUP operation 216. The xCDA Purged FOUP operation 216, which includes purging the inside environment of the semiconductor substrate container 12, e.g., the FOUP, and the wafers 27 inside the semiconductor substrate container 12 with extreme clean dry air or inert gas is described above with respect to FIGS. 1A and 1B. In some embodiments, a time interval exists between the exposure operation 214 and the next operation, the post-exposure bake (PEB) operation 218 and during the time interval (e.g., a storage period or a duration of storing) the semiconductor substrate container 12, e.g., the FOUP, is stored in a storage location (not shown). In some embodiments, there is an operation similar to the T-load port operation 212 after xCDA Purged FOUP operation 216 that transfers the semiconductor substrate container 12 to the storage location and then after the storage period transfers the semiconductor substrate container 12 from the storage location to a location for the next operation, which is a post-exposure bake (PEB) operation 218.

After the storage period, which may range from a few minutes to a few days, the semiconductor substrates, e.g., wafers 27, are removed from the semiconductor substrate container 12 (the FOUP) and are heated in the post-exposure bake (PEB) operation 218. In some embodiments, the semiconductor substrates are heated at a temperature ranging from about 50° C. to about 170° C. for about 20 seconds to about 120 seconds during the post-exposure bake. Then, the wafers 27 are again coated with a protective coating in an edge coating operation 220, in some embodiments, where in addition to wafer edges, sides, and backside of the wafers 27 may also be protected by the protective coating. The protective coating is baked in the edge coat (EC) baking operation 222. The baked edge coating prevents the metal-containing photoresist and the solvent of the metal-containing photoresist from spilling over the wafer edges contaminating other process locations that the wafer 27 is transferred to during the subsequent process steps.

Next, the photoresist is developed to generate a pattern in the photoresist layer in a development operation 224. In some embodiments, the development operation is a negative tone development (NTD) operation that develops portions of the photoresist layer at locations that are not exposed. In some embodiments, the development operation 224 is a positive tone development operation that develops portions of the photoresist layer at locations that are exposed. Subsequently, the protective coating is removed in edge coat (EC) stripping operation 226, and the patterned photoresist-coated substrate is heated to dry the patterned photoresist-coated wafer 27 in a baking operation 228 operation (Bake).

In some embodiments, the edge coat baking operations 204 and 222 are performed at a temperature and time sufficient to cure and dry the protective layers. In some embodiments, the protective layers are heated at a temperature of between about 40° C. and about 200° C. for about 10 seconds to about 10 minutes. In some embodiments, the photoresist layer is also heated at the post-application bake operation 210 at a temperature of between about 40° C. and about 200° C. for about 10 seconds to about 10 minutes.

Figure 3:
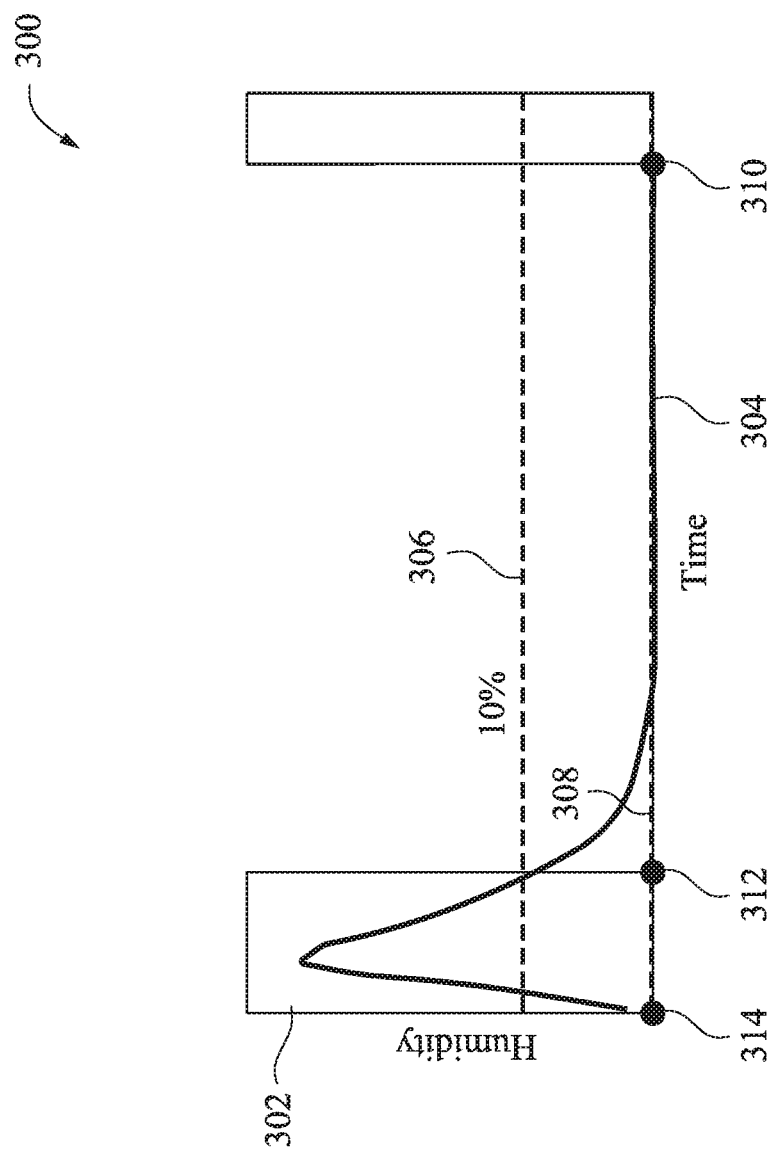
FIG. 3 illustrates a plot of relative humidity versus purge time in a front opening unified pod (FOUP) in accordance with some embodiments of the present disclosure.

FIG. 3 illustrates a plot 300 of relative humidity 302 versus purge time 304 in a FOUP, e.g., the semiconductor substrate container 12 of FIGS. 1A and 1B, in accordance with some embodiments of the present disclosure. In some embodiments, purging starts at a time 314 and the relative humidity 302 drops below 10% level 306 at a time 312 in about 50 seconds after the start of purging the FOUP with extreme clean dry air or inert gas. The relative humidity 302 drops below 1% level 308 in about 180 seconds 310 after the start of the purge. In some embodiments as shown in FIGS. 1A and 1B, after the start time 314 of the purge, while the door 15 is sealed, the extreme clean dry air or the inert gas is introduced to the semiconductor substrate container 12 via the gas inlet 20 and the gas purifier 40. After the start time 314 of the purge, the sensor 30 measures the relative humidity 302 of the gas that exits the gas outlet 25. As shown in the plot 300, the measured relative humidity 302 initially increases and then decreases. In some embodiments, the process of purging the semiconductor substrate container 12 and controlling the gas purifier 40, sensor 30, and opening/closing the gas inlet 20 and the gas outlet 25 is performed by the computer system 600 described in FIGS. 6A and 6B below.

Figures 4A, 4B:
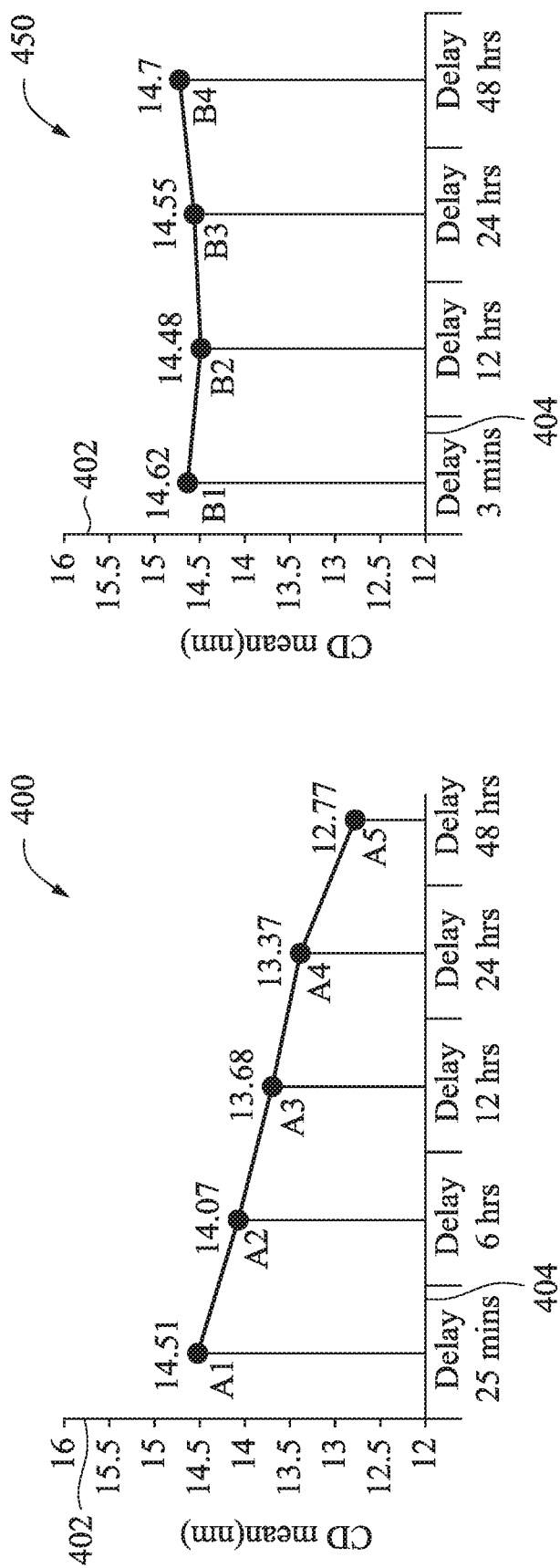
FIGS. 4A and 4B illustrate the change in critical dimension of an exposed metal photoresist after storage in a FOUP without and with purging the FOUP in accordance with some embodiments of the present disclosure.

FIGS. 4A and 4B illustrate the change in critical dimension of an exposed metal photoresist after storage in a FOUP without and with purging the FOUP in accordance with some embodiments of the present disclosure. Plot 400 of FIG. 4A shows a mean CD value in nm on vertical coordinate 402 versus a time 404 (storage time) the metal-containing photoresist coated substrates are stored in the FOUP. As shown in the plot 400 of FIG. 4A, the metal-containing photoresist coated substrates stored in a FOUP after actinic radiation exposure without performing an extreme clean dry air or inert gas purge exhibit a steady degradation in the critical dimension of the patterns in the developed photoresist. As shown in the plot 400, after 25 minutes the mean CD value at point A1 is 14.51 that may be assumed as the initial mean CD value. After 6 hours the mean CD value at point A2 is 14.07, after 12 hours the mean CD value at point A3 drops to 13.68, after 24 hours the mean CD value at point A4 decreases to 13.37, and after 48 hours the mean CD value at point A5 is down to 12.77. Thus, after 48 hours of storage, photoresist-coated substrates stored without purging suffer about a 12% degradation in the mean critical dimension compared to the initial mean CD value. The mean CD values displayed in the plot 400 represent mean values of the CDs measured at multiple locations of a wafer or measured at multiple locations of several wafers in the FOUP.

On the other hand, in some embodiments, metal-containing photoresist coated substrates stored in a FOUP that has been purged with extreme clean dry air or inert gas after actinic radiation exposure do not exhibit a steady degradation in the critical dimension of the patterns in the developed photoresist. As shown in plot 450 of FIG. 4B, after 3 minutes of storage the mean CD value at point B1 is 14.62 that may be assumed as the initial mean CD value, Also, after 12 hours the mean CD value at point B2 is 14.48, after 24 hours the mean CD value at point B3 is 14.55, and after 48 hours the mean CD value at point B4 is 14.70. Thus, after 48 hours of storage, the mean CD value of the substrates stored with purging is 14.70 had no appreciable change, less than 1%, compared to the initial mean CD value. As described, the mean CD values displayed in plot 450 represent mean values of the CDs measured at multiple locations of a wafer or measured at multiple locations of several wafers in the FOUP.

Figure 5:
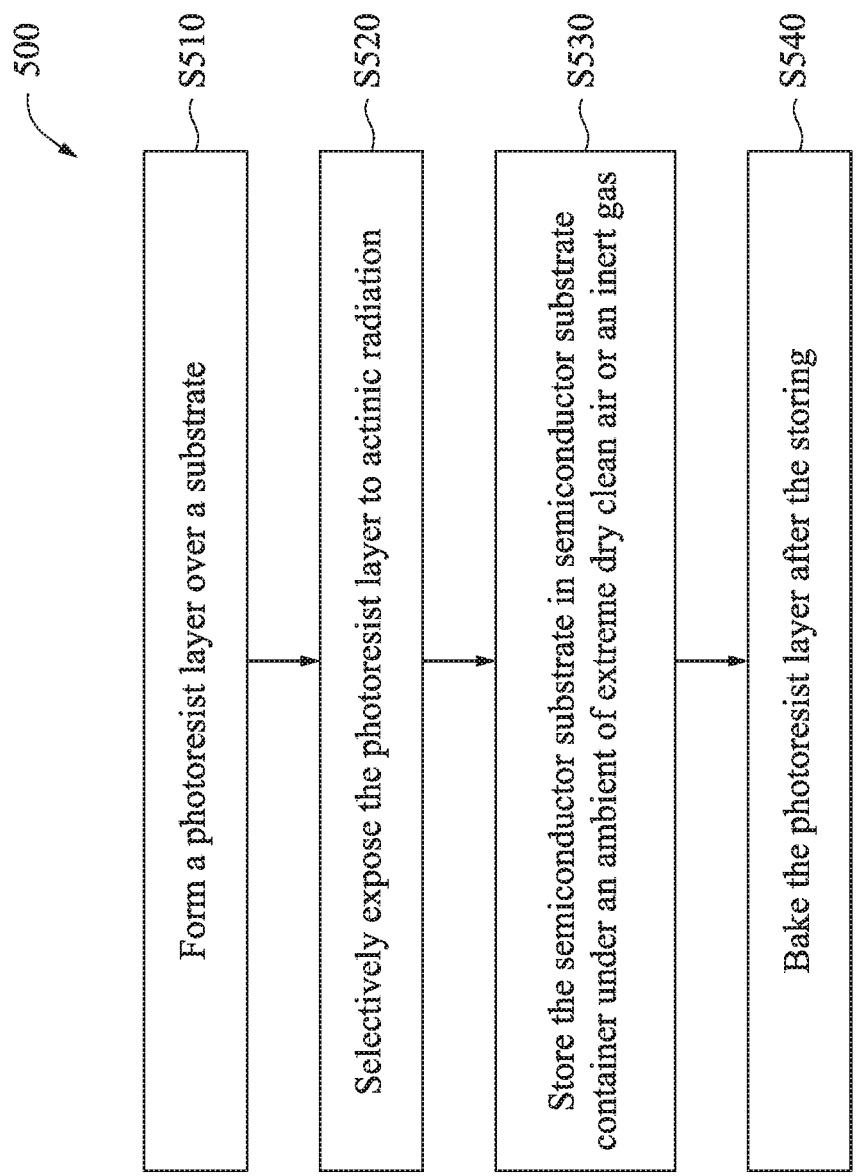
FIG. 5 illustrates a flow diagram of a process for manufacturing a semiconductor device in accordance with some embodiments of the present disclosure.

FIG. 5 illustrates a flow diagram of a process 500 for manufacturing a semiconductor device in accordance with some embodiments of the present disclosure. In operation S510, a photoresist layer is formed over a substrate. In some embodiments, a metal-containing photoresist layer is deposited on a wafer 27 of FIG. 1A or 1B. In operation S520, the photoresist layer on the substrate is selectively exposed to actinic radiation. In some embodiments, the photoresist layer is exposed to EUV radiation. In operation S530, the semiconductor substrate is stored in a semiconductor substrate container, e.g., the semiconductor substrate container 12 under an ambient of extreme dry clean air or an inert gas. In some embodiments, the semiconductor substrate container is a FOUP. In operation S540, after the storing, the photoresist layer is heated in a post-exposure bake. In some embodiments, the photoresist coated substrate is baked at a temperature of about 50° C. to about 160° C. for about 10 seconds to about 120 seconds during post-exposure bake.

Figure 6A:
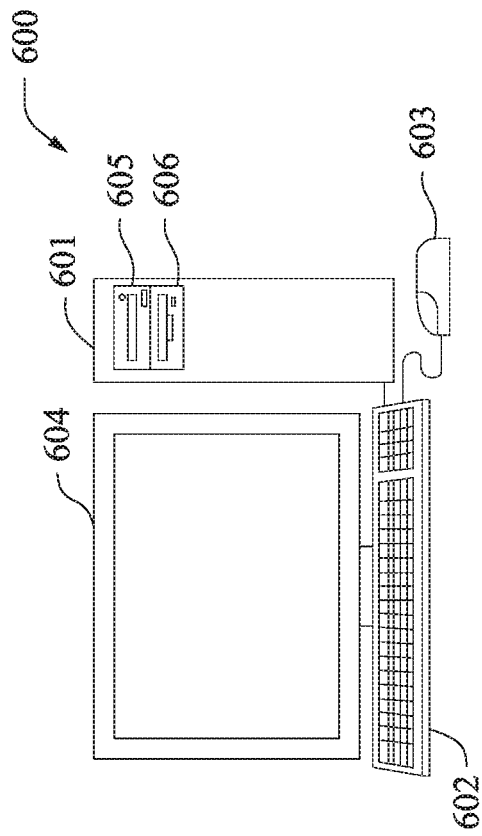
FIGS. 6A and 6B illustrate an apparatus for purging the semiconductor substrate container of water vapor in accordance with some embodiments of the present disclosure.
Figure 6B:
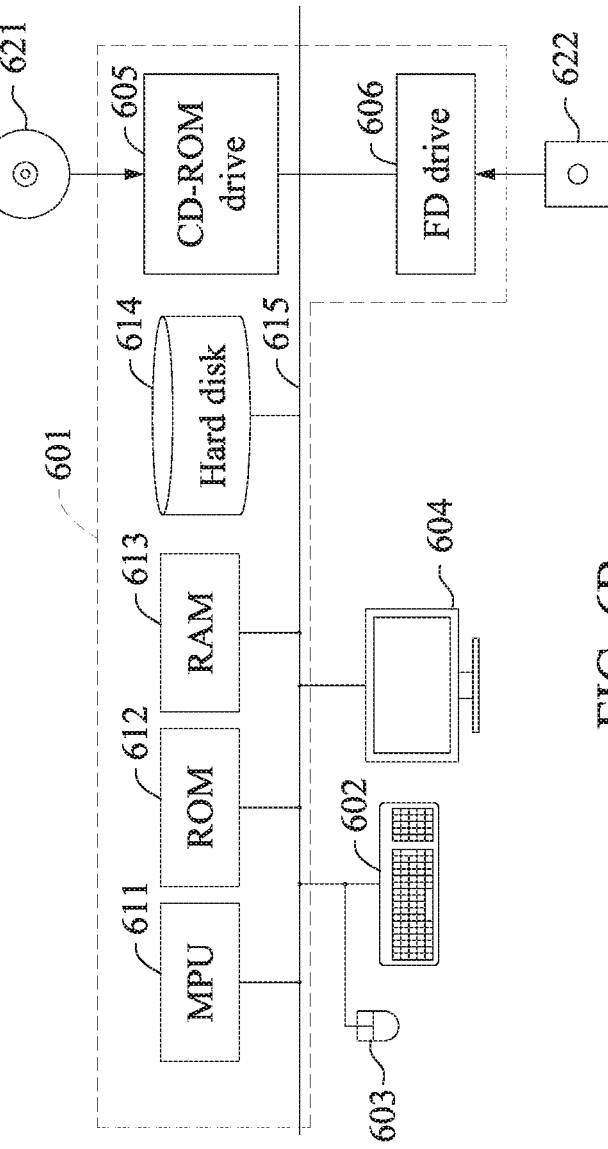

FIGS. 6A and 6B illustrate an apparatus for purging the semiconductor substrate container of water vapor in accordance with some embodiments of the present disclosure. FIG. 6A is a schematic view of a computer system that controls the purging of a FOUP with extreme clean dry air or inert gas to remove the water vapor from the FOUP according to one or more embodiments as described above. All of or a part of the processes, method and/or operations of the foregoing embodiments can be realized using computer hardware and computer programs executed thereon. The operations include monitoring moisture and purging the semiconductor substrate container 12 (the FOUP). In FIG. 6A, a computer system 600 is provided with a computer 601 including an optical disk read only memory (e.g., CD-ROM or DVD-ROM) drive 605 and a magnetic disk drive 606, a keyboard 602, a mouse 603, and a monitor 604, in some embodiments.

FIG. 6B is a diagram showing an internal configuration of the computer system 600. In FIG. 6B, the computer 601 is provided with, in addition to the optical disk drive 605 and the magnetic disk drive 606, one or more processors 611, such as a micro processing unit (MPU), a ROM 612 in which a program such as a boot up program is stored, a random access memory (RAM) 613 that is connected to the MPU 611 and in which a command of an application program is temporarily stored and a temporary storage area is provided, a hard disk 614 in which an application program, a system program, and data are stored, and a bus 615 that connects the MPU 611, the ROM 612, and the like. Note that the computer 601 may include a network card (not shown) for providing a connection to a LAN.

The program for causing the computer system 600 to execute the functions of the purging water vapor from the FOUP in the foregoing embodiments may be stored in an optical disk 621 or a magnetic disk 622, which are inserted into the optical disk drive 605 or the magnetic disk drive 606, and transmitted to the hard disk 614. Alternatively, the program may be transmitted via a network (not shown) to the computer 601 and stored in the hard disk 614. At the time of execution, the program is loaded into the RAM 613. The program may be loaded from the optical disk 621 or the magnetic disk 622, or directly from a network. The program does not necessarily have to include, for example, an operating system (OS) or a third party program to cause the computer 601 to execute the functions of the photo mask data generating and merging apparatus in the foregoing embodiments. The program may only include a command portion to call an appropriate function (module) in a controlled mode and obtain desired results. In some embodiments, one of the processors 611 comprises a controller.

In some embodiments, the photoresist layer is exposed to ultraviolet radiation, such as deep ultraviolet radiation. In some embodiments, the ultraviolet radiation is extreme ultraviolet radiation. In some embodiments, the radiation is an electron beam.

In some embodiments, the exposure radiation passes through a photomask before irradiating the photoresist layer in some embodiments. In some embodiments, the photomask has a pattern to be replicated in the photoresist layer. The pattern is formed by an opaque pattern on a photomask substrate, in some embodiments. The opaque pattern may be formed by a material opaque to ultraviolet radiation, such as chromium, while the photomask substrate is formed of a material that is transparent to ultraviolet radiation, such as fused quartz. In some embodiments, the exposure radiation is reflected off of a photomask. In some embodiments, the photomask includes a pattern of radiation reflective areas and absorbing areas.

The regions of the photoresist layer exposed to radiation undergo a chemical reaction thereby changing their solubility in a subsequently applied developer relative to the regions of the photoresist layer not exposed to radiation. In some embodiments, the portions of the photoresist layer and protective layer exposed to radiation undergo a crosslinking reaction.

Next, the photoresist layer undergoes a post-exposure bake operation. In some embodiments, the photoresist layer is heated to a temperature of about 50° C. and 160° C. for about 20 seconds to about 120 seconds. The post-exposure baking may be used in order to assist in the generating, dispersing, and reacting of an acid/base/free radical generated from the impingement of the radiation upon the photoresist layer during the exposure. Such thermal assistance helps create or enhance chemical reactions, which generate chemical differences between the exposed regions and the unexposed regions within the photoresist layer. These chemical differences also cause differences in the solubility between the exposed region and the unexposed region.

The selectively exposed photoresist layer is subsequently developed by applying a developer to the selectively exposed photoresist layer in a development operation.

In some embodiments, the substrate includes a single crystalline semiconductor layer on at least it surface portion. The substrate may include a single crystalline semiconductor material such as, but not limited to Si, Ge, SiGe, GaAs, InSb, GaP, GaSb, InAlAs, InGaAs, GaSbP, GaAsSb and InP. In some embodiments, the substrate is a silicon layer of an SOI (silicon-on insulator) substrate. In certain embodiments, the substrate is made of crystalline Si.

The substrate may include in its surface region, one or more buffer layers (not shown). The buffer layers can serve to gradually change the lattice constant from that of the substrate to that of subsequently formed source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. In an embodiment, the silicon germanium (SiGe) buffer layer is epitaxially grown on the silicon substrate. The germanium concentration of the SiGe buffer layers may increase from 30 atomic % for the bottom-most buffer layer to 70 atomic % for the top-most buffer layer.

In some embodiments, the substrate includes at least one metal, metal alloy, and metal/nitride/sulfide/oxide/silicide having the formula $MX_a$, where M is a metal and X is N, S, Se, O, Si, and a is from about 0.4 to about 2.5. In some embodiments, the substrate includes titanium, aluminum, cobalt, ruthenium, titanium nitride, tungsten nitride, tantalum nitride, and combinations thereof.

In some embodiments, the substrate includes a dielectric having at least silicon, metal oxide, and metal nitride of the formula $MX_b$, where M is a metal or Si, X is N or O, and b ranges from about 0.4 to about 2.5. Ti, Al, Hf, Zr, and La are suitable metals, M, in some embodiments. In some embodiments, the substrate includes silicon dioxide, silicon nitride, aluminum oxide, hafnium oxide, lanthanum oxide, and combinations thereof.

In some embodiments, the photoresist layer is a photosensitive layer that is patterned by exposure to actinic radiation. Typically, the chemical properties of the photoresist regions struck by incident radiation change in a manner that depends on the type of photoresist used. Photoresist layers are either positive tone resists or negative tone resists. Positive tone resist refers to a photoresist material that when exposed to radiation (typically UV light) becomes soluble in a developer, while the region of the photoresist that is non-exposed (or exposed less) is insoluble in the developer. Negative tone resist, on the other hand, refers to a photoresist material that when exposed to radiation becomes insoluble in the developer, while the region of the photoresist that is non-exposed (or exposed less) is soluble in the developer. The region of a negative tone resist that becomes insoluble upon exposure to radiation may become insoluble due to a cross-linking reaction caused by the exposure to radiation.

Whether a photoresist is a positive tone or negative tone may depend on the type of developer used to develop the resist. For example, some positive tone photoresists provide a positive pattern, (i.e.—the exposed regions are removed by the developer), when the developer is an aqueous-based developer, such as a tetramethylammonium hydroxide (TMAH) solution. On the other hand, the same photoresist provides a negative pattern (i.e.—the unexposed regions are removed by the developer) when the developer is an organic solvent. Further, in some negative tone photoresists developed with the TMAH solution, the unexposed regions of the photoresist are removed by the TMAH, and the exposed regions of the photoresist, that undergo cross-linking upon exposure to actinic radiation, remain on the substrate after development.

In some embodiments, photoresists include a polymer resin along with one or more photoactive compounds (PACs) in a solvent, in some embodiments. In some embodiments, the polymer resin includes a hydrocarbon structure (such as an alicyclic hydrocarbon structure) that contains one or more groups that will decompose (e.g., acid labile groups or acid leaving groups) or otherwise react when mixed with acids, bases, or free radicals generated by the PACs (as further described below). In some embodiments, the hydrocarbon structure includes a repeating unit that forms a skeletal backbone of the polymer resin. This repeating unit may include acrylic esters, methacrylic esters, crotonic esters, vinyl esters, maleic diesters, fumaric diesters, itaconic diesters, (meth)acrylonitrile, (meth)acrylamides, styrenes, vinyl ethers, combinations of these, or the like.

In some embodiments, the photoresist includes a polymer resin having acid leaving groups selected from the following:

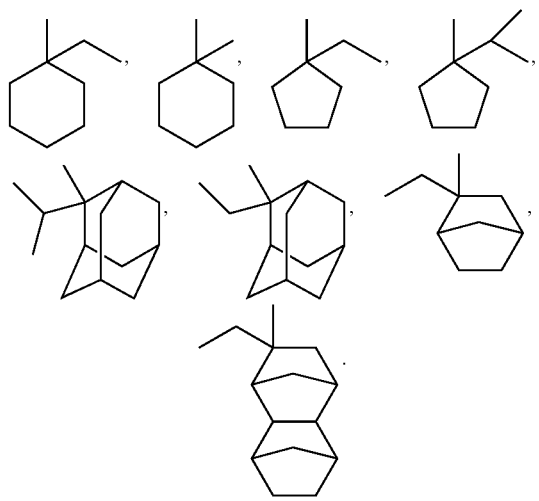

Specific structures that are utilized for the repeating unit of the hydrocarbon structure in some embodiments, include one or more of methyl acrylate, ethyl acrylate, n-propyl acrylate, isopropyl acrylate, n-butyl acrylate, isobutyl acrylate, tert-butyl acrylate, n-hexyl acrylate, 2-ethylhexyl acrylate, acetoxyethyl acrylate, phenyl acrylate, 2-hydroxyethyl acrylate, 2-methoxyethyl acrylate, 2-ethoxyethyl acrylate, 2-(2-methoxyethoxy)ethyl acrylate, cyclohexyl acrylate, benzyl acrylate, 2-alkyl-2-adamantyl (meth)acrylate or dialkyl(1-adamantyl)methyl (meth)acrylate, methyl methacrylate, ethyl methacrylate, n-propyl methacrylate, isopropyl methacrylate, n-butyl methacrylate, isobutyl methacrylate, tert-butyl methacrylate, n-hexyl methacrylate, 2-ethylhexyl methacrylate, acetoxyethyl methacrylate, phenyl methacrylate, 2-hydroxyethyl methacrylate, 2-methoxyethyl methacrylate, 2-ethoxyethyl methacrylate, 2-(2-methoxyethoxy) ethyl methacrylate, cyclohexyl methacrylate, benzyl methacrylate, 3-chloro-2-hydroxypropyl methacrylate, 3-acetoxy-2-hydroxypropyl methacrylate, 3-chloroacetoxy-2-hydroxypropyl methacrylate, butyl crotonate, hexyl crotonate, or the like. Examples of the vinyl esters include vinyl acetate, vinyl propionate, vinyl butylate, vinyl methoxyacetate, vinyl benzoate, dimethyl maleate, diethyl maleate, dibutyl maleate, dimethyl fumarate, diethyl fumarate, dibutyl fumarate, dimethyl itaconate, diethyl itaconate, dibutyl itaconate, acrylamide, methyl acrylamide, ethyl acrylamide, propyl acrylamide, n-butyl acrylamide, tert-butyl acrylamide, cyclohexyl acrylamide, 2-methoxyethyl acrylamide, dimethyl acrylamide, diethyl acrylamide, phenyl acrylamide, benzyl acrylamide, methacrylamide, methyl methacrylamide, ethyl methacrylamide, propyl methacrylamide, n-butyl methacrylamide, tert-butyl methacrylamide, cyclohexyl methacrylamide, 2-methoxyethyl methacrylamide, dimethyl methacrylamide, diethyl methacrylamide, phenyl methacrylamide, benzyl methacrylamide, methyl vinyl ether, butyl vinyl ether, hexyl vinyl ether, methoxyethyl vinyl ether, dimethylaminoethyl vinyl ether, or the like. Examples of styrenes include styrene, methyl styrene, dimethyl styrene, trimethyl styrene, ethyl styrene, isopropyl styrene, butyl styrene, methoxy styrene, butoxy styrene, acetoxy styrene, chloro styrene, dichloro styrene, bromo styrene, vinyl methyl benzoate, α-methyl styrene, maleimide, vinylpyridine, vinylpyrrolidone, vinylcarbazole, combinations of these, or the like.

In some embodiments, the repeating unit of the hydrocarbon structure also has either a monocyclic or a polycyclic hydrocarbon structure substituted into it, or the monocyclic or polycyclic hydrocarbon structure is the repeating unit, in order to form an alicyclic hydrocarbon structure. Specific examples of monocyclic structures in some embodiments include bicycloalkane, tricycloalkane, tetracycloalkane, cyclopentane, cyclohexane, or the like. Specific examples of polycyclic structures in some embodiments include adamantane, norbornane, isobornane, tricyclodecane, tetracyclododecane, or the like.

The group which will decompose is attached to the hydrocarbon structure so that, it will react with the acids/bases/free radicals generated by the PACs during exposure. Groups that react with acids are known as acid-labile groups. In some embodiments, the group which will decompose is a carboxylic acid group, a fluorinated alcohol group, a phenolic alcohol group, a sulfonic group, a sulfonamide group, a sulfonylimido group, an (alkylsulfonyl) (alkylcarbonyl) methylene group, an (alkylsulfonyl)(alkyl-carbonyl)imido group, a bis(alkylcarbonyl)methylene group, a bis(alkylcarbonyl)imido group, a bis(alkylsylfonyl)methylene group, a bis(alkylsulfonyl)imido group, a tris(alkylcarbonyl methylene group, a tris(alkylsulfonyl)methylene group, combinations of these, or the like. Specific groups that are used for the fluorinated alcohol group include fluorinated hydroxyalkyl groups, such as a hexafluoroisopropanol group in some embodiments. Specific groups that are used for the carboxylic acid group include acrylic acid groups, methacrylic acid groups, or the like.

In some embodiment, the acid-labile group (ALG) decomposes by the action of the acid generated by the photo-acid generator leaving a carboxylic acid group pendant to the polymer resin chain, as shown in the ALG de-protect reaction:

ALG de-protect reaction

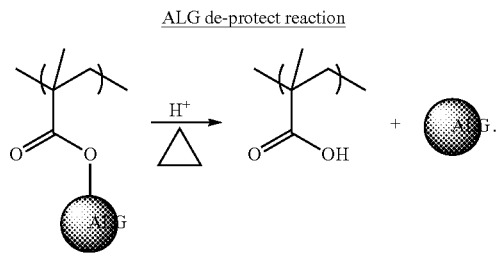

In some embodiments, the polymer resin also includes other groups attached to the hydrocarbon structure that help to improve a variety of properties of the polymerizable resin. For example, inclusion of a lactone group to the hydrocarbon structure assists to reduce the amount of line edge roughness after the photoresist has been developed, thereby helping to reduce the number of defects that occur during development. In some embodiments, the lactone groups include rings having five to seven members, although any suitable lactone structure may alternatively be used for the lactone group.

In some embodiments, the polymer resin includes groups that can assist in increasing the adhesiveness of the photoresist layer to underlying structures (e.g., substrate). Polar groups may be used to help increase the adhesiveness. Suitable polar groups include hydroxyl groups, cyano groups, or the like, although any suitable polar group may, alternatively, be used.

Optionally, the polymer resin includes one or more alicyclic hydrocarbon structures that do not also contain a group which will decompose in some embodiments. In some embodiments, the hydrocarbon structure that does not contain a group which will decompose includes structures such as 1-adamantyl(meth)acrylate, tricyclodecanyl (meth)acrylate, cyclohexyl (methacrylate), combinations of these, or the like.

Additionally, some embodiments of the photoresist include one or more photoactive compounds (PACs). The PACs are photoactive components, such as photo-acid generators, photo base generators, free-radical generators, or the like. The PACs may be positive-acting or negative-acting. In some embodiments in which the PACs are a photo-acid generator, the PACs include halogenated triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenated sulfonyloxy dicarboximides, diazodisulfones, α-cyanooxyaminesulfonates, imidesulfonates, ketodiazosulfones, sulfonyldiazoesters, 1,2-di(arylsulfonyl)hydrazines, nitrobenzyl esters, and the s-triazine derivatives, combinations of these, or the like.

Specific examples of photo-acid generators include α-(trifluoromethylsulfonyloxy)-bicyclo[2.2.1]hept-5-ene-2,3-dicarb-o-ximide (MDT), N-hydroxy-naphthalimide (DDSN), benzoin tosylate, t-butylphenyl-α-(p-toluenesulfonyloxy)-acetate and t-butyl-α-(p-toluenesulfonyloxy)-acetate, triarylsulfonium and diaryliodonium hexafluoroantimonates, hexafluoroarsenates, trifluoromethanesulfonates, iodonium perfluorooctanesulfonate, N-camphorsulfonyloxynaphthalimide, N-pentafluorophenylsulfonyloxynaphthalimide, ionic iodonium sulfonates such as diaryl iodonium (alkyl or aryl)sulfonate and bis-(di-t-butylphenyl)iodonium camphanylsulfonate, perfluoroalkanesulfonates such as perfluoropentanesulfonate, perfluorooctanesulfonate, perfluoromethanesulfonate, aryl (e.g., phenyl or benzyl)triflates such as triphenylsulfonium triflate or bis-(t-butylphenyl)iodonium triflate; pyrogallol derivatives (e.g., trimesylate of pyrogallol), trifluoromethanesulfonate esters of hydroxyimides, α,α'-bis-sulfonyl-diazomethanes, sulfonate esters of nitro-substituted benzyl alcohols, naphthoquinone-4-diazides, alkyl disulfones, or the like.

Structures of photo-acid generators according to the embodiments of the disclosure include:

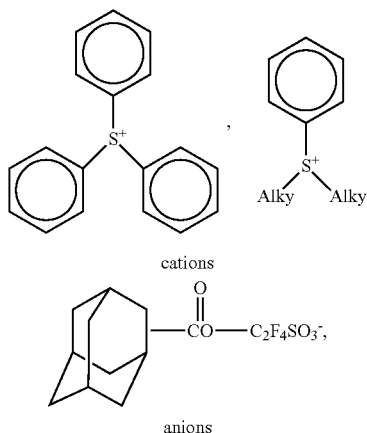

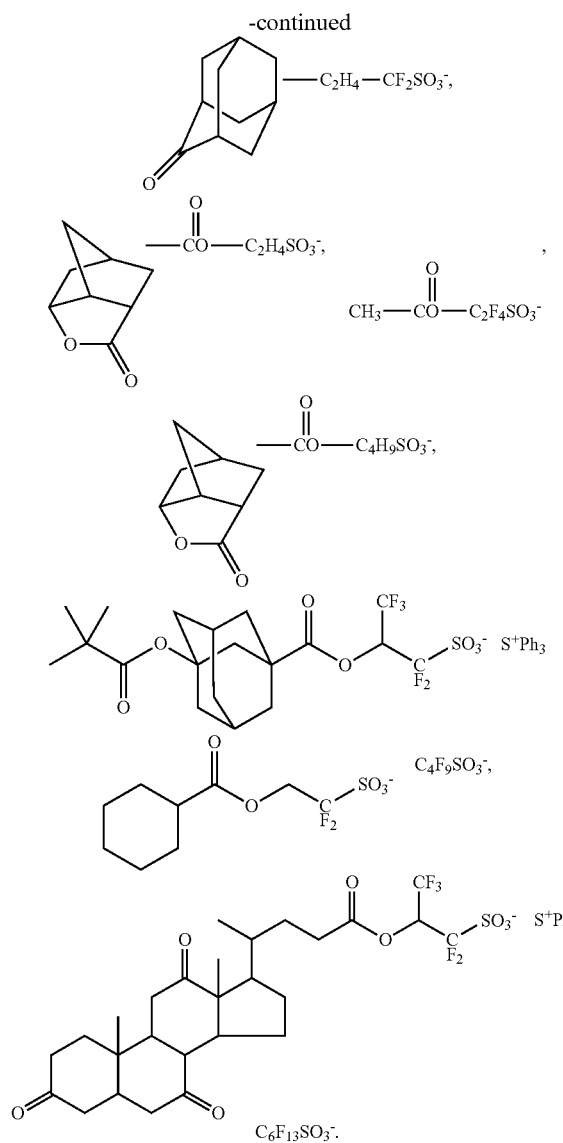

In some embodiments in which the PACs are free-radical generators, the PACs include n-phenylglycine; aromatic ketones, including benzophenone, N,N'-tetramethyl-4,4'-diaminobenzophenone, N,N'-tetraethyl-4,4'-diaminobenzophenone, 4-methoxy-4'-dimethylaminobenzo-phenone, 3,3'-dimethyl-4-methoxybenzophenone, p,p'-bis (dimethylamino)benzo-phenone, p,p'-bis(diethylamino)-benzophenone, anthraquinone, 2-ethylanthraquinone; naphthaquinone; and phenanthraquinone; benzoins including benzoin, benzoinmethylether, benzoinisopropylether, benzoin-n-butylether, benzoin-phenylether, methylbenzoin and ethylbenzoin; benzyl derivatives, including dibenzyl, benzyldiphenyldisulfide, and benzyldimethylketal; acridine derivatives, including 9-phenylacridine, and 1,7-bis(9-acridinyl)heptane; thioxanthones, including 2-chlorothioxanthone, 2-methylthioxanthone, 2,4-diethylthioxanthone, 2,4-dimethylthioxanthone, and 2-isopropylthioxanthone; acetophenones, including 1,1-dichloroacetophenone, p-t-butyldichloro-acetophenone, 2,2-diethoxyacetophenone, 2,2-dimethoxy-2-phenylacetophenone, and 2,2-dichloro-4-phenoxyacetophenone; 2,4,5-triarylimidazole dimers, including 2-(o-chlorophenyl)-4,5-diphenylimidazole dimer, 2-(o-chlorophenyl)-4,5-di-(m-methoxyphenyl imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer, 2,4-di(p-methoxyphenyl)-5-phenylimidazole dimer, 2-(2,4-dimethoxyphenyl)-4,5-diphenylimidazole dimer and 2-(p-methylmercaptophenyl)-4,5-diphenylimidazole dimmer; combinations of these, or the like.

In some embodiments in which the PACs are photobase generators, the PACs includes quaternary ammonium dithiocarbamates, a aminoketones, oxime-urethane containing molecules such as dibenzophenoneoxime hexamethylene diurethan, ammonium tetraorganylborate salts, and N-(2-nitrobenzyloxycarbonyl)cyclic amines, combinations of these, or the like.

As one of ordinary skill in the art will recognize, the chemical compounds listed herein are merely intended as illustrated examples of the PACs and are not intended to limit the embodiments to only those PACs specifically described. Rather, any suitable PAC may be used, and all such PACs are fully intended to be included within the scope of the present embodiments.

In some embodiments, a cross-linking agent is added to the photoresist. The cross-linking agent reacts with one group from one of the hydrocarbon structures in the polymer resin and also reacts with a second group from a separate one of the hydrocarbon structures in order to cross-link and bond the two hydrocarbon structures together. This bonding and cross-linking increases the molecular weight of the polymer products of the cross-linking reaction and increases the overall linking density of the photoresist. Such an increase in density and linking density helps to improve the resist pattern.

In some embodiments the cross-linking agent has the following structure:

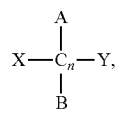

such that C is carbon, n ranges from 1 to 15; A and B independently include a hydrogen atom, a hydroxyl group, a halide, an aromatic carbon ring, or a straight or cyclic alkyl, alkoxyl/fluoro, alkyl/fluoroalkoxyl chain having a carbon number of between 1 and 12, and each carbon C contains A and B; a first terminal carbon C at a first end of a carbon C chain includes X and a second terminal carbon C at a second end of the carbon chain includes Y, such that X and Y independently include an amine group, a thiol group, a hydroxyl group, an isopropyl alcohol group, or an isopropyl amine group, except when n=1 then X and Y are bonded to the same carbon C. Specific examples of materials that may be used as the cross-linking agent include the following:

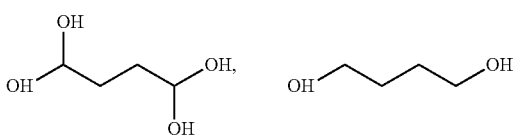

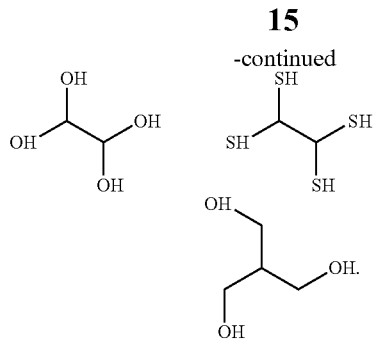

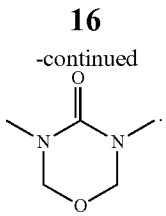

Alternatively, instead of or in addition to the cross-linking agent being added to the photoresist composition, a coupling reagent is added in some embodiments, in which the coupling reagent is added in addition to the cross-linking agent. The coupling reagent assists the cross-linking reaction by reacting with the groups on the hydrocarbon structure in the polymer resin before the cross-linking reagent, allowing for a reduction in the reaction energy of the cross-linking reaction and an increase in the rate of reaction. The bonded coupling reagent then reacts with the cross-linking agent, thereby coupling the cross-linking agent to the polymer resin.

Alternatively, in some embodiments in which the coupling reagent is added to the photoresist without the cross-linking agent, the coupling reagent is used to couple one group from one of the hydrocarbon structures in the polymer resin to a second group from a separate one of the hydrocarbon structures in order to cross-link and bond the two polymers together. However, in such an embodiment the coupling reagent, unlike the cross-linking agent, does not remain as part of the polymer, and only assists in bonding one hydrocarbon structure directly to another hydrocarbon structure.

In some embodiments, the coupling reagent has the following structure:

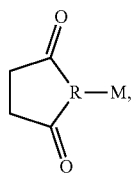

where R is a carbon atom, a nitrogen atom, a sulfur atom, or an oxygen atom; M includes a chlorine atom, a bromine atom, an iodine atom, —NO$_2$; —SO$_3$—; —H—; —CN; —NCO, —OCN; —CO$_2$—; —OH; —OR*, —OC(O)CR*; —SR, —SO$_2$N(R*)$_2$; —SO$_2$R*; SOR; —OC(O)R*; —C(O)OR*; —C(O)R*; —Si(OR*)$_3$; —Si(R*)$_3$; epoxy groups, or the like; and R* is a substituted or unsubstituted C1-C12 alkyl, C1-C12 aryl, C1-C12 aralkyl, or the like. Specific examples of materials used as the coupling reagent in some embodiments include the following:

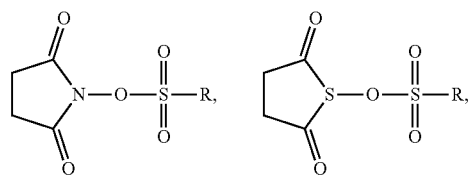

In some embodiments, the solvent is an organic solvent, and includes one or more of any suitable solvent such as ketones, alcohols, polyalcohols, ethers, glycol ethers, cyclic ethers, aromatic hydrocarbons, esters, propionates, lactates, lactic esters, alkylene glycol monoalkyl ethers, alkyl lactates, alkyl alkoxypropionates, cyclic lactones, monoketone compounds that contain a ring, alkylene carbonates, alkyl alkoxyacetate, alkyl pyruvates, lactate esters, ethylene glycol alkyl ether acetates, diethylene glycols, propylene glycol alkyl ether acetates, alkylene glycol alkyl ether esters, alkylene glycol monoalkyl esters, or the like.

Specific examples of materials that may be used as the solvent for the photoresist include, acetone, methanol, ethanol, toluene, xylene, 4-hydroxy-4-methyl-2-pentatone, tetrahydrofuran, methyl ethyl ketone, cyclohexanone, methyl isoamyl ketone, 2-heptanone, ethylene glycol, ethylene glycol monoacetate, ethylene glycol dimethyl ether, ethylene glycol dimethyl ether, ethylene glycol methylethyl ether, ethylene glycol monoethyl ether, methyl cellosolve acetate, ethyl cellosolve acetate, diethylene glycol, diethylene glycol monoacetate, diethylene glycol monomethyl ether, diethylene glycol diethyl ether, diethylene glycol dimethyl ether, diethylene glycol ethylmethyl ether, diethethylene glycol monocthyl ether, diethylene glycol monobutyl ether, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-2-methylbutanate, methyl 3-methoxypropionate, ethyl 3-methoxypropionate, methyl 3-ethoxypropionate, ethyl 3-ethoxypropionate, methyl acetate, ethyl acetate, propyl acetate, butyl acetate, methyl lactate, ethyl lactate, propyl lactate, butyl lactate, propylene glycol, propylene glycol monoacetate, propylene glycol monocthyl ether acetate, propylene glycol monomethyl ether acetate, propylene glycol monopropyl methyl ether acetate, propylene glycol monobutyl ether acetate, propylene glycol monobutyl ether acetate, propylene glycol monomethyl ether propionate, propylene glycol monoethyl ether propionate, propylene glycol methyl ether acetate, propylene glycol ethyl ether acetate, ethylene glycol monomethyl ether acetate, ethylene glycol monoethyl ether acetate, propylene glycol monomethyl ether, propylene glycol monoethyl ether, propylene glycol monopropyl ether, propylene glycol monobutyl ether, ethylene glycol monomethyl ether, ethylene glycol monoethyl ether, ethyl 3-ethoxypropionate, methyl 3-methoxypropionate, methyl 3-ethoxypropionate, and ethyl 3-methoxypropionate, β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone, 2-butanone, 3-methylbutanone, pinacolone, 2-pentanone, 3-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonanone, 3-nonanone, 5-nonanone, 2-decanone, 3-decanone, 4-decanone, 5-hexene-2-one, 3-pentene-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclohexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methylcycloheptanone, 3-methylcycloheptanone, propylene carbonate, vinylene carbonate, ethylene carbonate, butylene carbonate, acetate-2-methoxyethyl, acetate-2-ethoxyethyl, acetate-2-(2-ethoxyethoxy)ethyl, acetate-3-methoxy-3-methylbutyl, acetate-1-methoxy-2-propyl, dipropylene glycol, monomethylether, monoethylether, monopropylether, monobutylether, monophenylether, dipropylene glycol monoacetate, dioxane, methyl pyruvate, ethyl pyruvate, propyl pyruvate, methyl methoxypropionate, ethyl ethoxypropionate, n-methylpyrrolidone (NMP), 2-methoxyethyl ether (diglyme), ethylene glycol monomethyl ether, propylene glycol monomethyl ether, methyl propionate, ethyl propionate, ethyl ethoxy propionate, methylethyl ketone, cyclohexanone, 2-heptanone, cyclopentanone, cyclohexanone, ethyl 3-ethoxypropionate, propylene glycol methyl ether acetate (PGMEA), methylene cellosolve, 2-ethoxyethanol, N-methylformamide, N,N-dimethylformamide, N-methylformanilide, N-methylacetamide, N,N-dimethylacetamide, dimethylsulfoxide, benzyl ethyl ether, dihexyl ether, acetonylacetone, isophorone, caproic acid, caprylic acid, 1-octanol, 1-nonanol, benzyl alcohol, benzyl acetate, ethyl benzoate, diethyl oxalate, diethyl maleate, phenyl cellosolve acetate, or the like.

As one of ordinary skill in the art will recognize, the materials listed and described above as examples of materials that may be used for the solvent component of the photoresist are merely illustrative and are not intended to limit the embodiments. Rather, any suitable materials that dissolve the polymer resin and the PACs may be used to help mix and apply the photoresist. All such materials are fully intended to be included within the scope of the embodiments.

Additionally, while individual ones of the above described materials may be used as the solvent for the photoresist and protective polymer, in other embodiments more than one of the above described materials are used. For example, in some embodiments, the solvent includes a combination mixture of two or more of the materials described. All such combinations are fully intended to be included within the scope of the embodiments.

In addition to the polymer resins, the PACs, the solvents, the cross-linking agent, and the coupling reagent, some embodiments of the photoresist also includes a number of other additives that assist the photoresist to obtain high resolution. For example, some embodiments of the photoresist also includes surfactants in order to help improve the ability of the photoresist to coat the surface on which it is applied.

Another additive added to some embodiments of the photoresist composition and protective layer composition is a quencher, which inhibits diffusion of the generated acids/bases/free radicals within the photoresist. The quencher improves the resist pattern configuration as well as the stability of the photoresist over time. In some embodiments, the quencher is a photo decomposed base. In some embodiments, an organic acid is used as the quencher.

Another additive added to some embodiments of the photoresist is a stabilizer, which assists in preventing undesired diffusion of the acids generated during exposure of the photoresist. Another additive in some embodiments of the photoresist is a dissolution inhibitor to help control dissolution of the photoresist during development. Another additive in some embodiments of the photoresist is a plasticizer. Plasticizers may be used to reduce delamination and cracking between the photoresist and underlying layers (e.g., the layer to be patterned). A coloring agent is another additive included in some embodiments of the photoresist. The coloring agent observers examine the photoresist and find any defects that may need to be remedied prior to further processing. Adhesion additives are added to some embodiments of the photoresist to promote adhesion between the photoresist and an underlying layer upon which the photoresist has been applied (e.g., the layer to be patterned). Surface leveling agents are added to some embodiments of the photoresist to assist a top surface of the photoresist to be level, so that impinging light will not be adversely modified by an unlevel surface.

Some embodiments of the photoresist include metal oxide nanoparticles. In some embodiments, the photoresist includes one or more metal oxides nanoparticles selected from the group consisting of titanium dioxide, zinc oxide, zirconium dioxide, nickel oxide, cobalt oxide, manganese oxide, copper oxides, iron oxides, strontium titanate, tungsten oxides, vanadium oxides, chromium oxides, tin oxides, hafnium oxide, indium oxide, cadmium oxide, molybdenum oxide, tantalum oxides, niobium oxide, aluminum oxide, and combinations thereof. As used herein, nanoparticles are particles having an average particle size between about 1 and about 10 nm. In some embodiments, the metal oxide nanoparticles have an average particle size between about 2 and about 5 nm. In some embodiments, the amount of metal oxide nanoparticles in the photoresist composition ranges from about 0.1 wt. % to about 20 wt. % based on the total weight of the photoresist composition. In some embodiments, the amount of nanoparticles in the photoresist composition ranges from about 1 wt. % to about 10 wt. % based on the total weight of the photoresist composition. In some embodiments, the amount of metal oxide nanoparticles in the photoresist composition ranges from about 1 wt. % to about 15 wt. % based on the weight of the first solvent. In some embodiments, the amount of nanoparticles in the photoresist composition ranges from about 5 wt. % to about 10 wt. % based on the weight of the first solvent. Below about 1 wt. % metal oxide nanoparticles the photoresist coating is too thin. Above about 15 wt. % metal oxide nanoparticles the photoresist coating is too thick.

In some embodiments, the metal oxide nanoparticles are complexed with a ligand. In some embodiments, the ligand is a carboxylic acid or sulfonic acid ligand. For example, in some embodiments, zirconium oxide or hafnium oxide nanoparticles are complexed with methacrylic acid forming hafnium methacrylic acid (HfMAA) or zirconium methacrylic acid (ZrMAA). In some embodiments, the metal oxide nanoparticles are complexed with ligands including aliphatic or aromatic groups. The aliphatic or aromatic groups may be unbranched or branched with cyclic or noncyclic saturated pendant groups containing 1-9 carbons, including alkyl groups, alkenyl groups, and phenyl groups. The branched groups may be further substituted with oxygen or halogen.

In some embodiments, the photoresist composition includes about 0.1 wt. % to about 20 wt. % of the ligand. In some embodiments, the photoresist includes about 1 wt. % to about 10 wt. % of the ligand. In some embodiments, the ligand is HfMAA or ZrMAA dissolved at about a 5 wt. % to about 10 wt. % weight range in a coating solvent, such as propylene glycol methyl ether acetate (PGMEA).

Embodiments of the present disclosure provide greater flexibility in the semiconductor device manufacturing process because after the photolithographic exposure step metal-containing photoresist coated substrates do not have to undergo post-exposure bake immediately after exposure to actinic radiation. Furthermore, the semiconductor manufacturing line does not have to be configured so that that actinic radiation exposed photoresist coated substrates are routed directly into a post-exposure bake tool. Embodiments of the present disclosure provide increased wafer per hour throughput over conventional manufacturing methods. In addition, the methods according to the present disclosure provide improved control of the critical dimension of the photoresist pattern and storing the substrates in extreme clean dry air or inert gas reduces impurities that may form on the photoresist surface.

According to some embodiments of the present disclosure, a method for manufacturing a semiconductor device includes forming a photoresist layer over a semiconductor substrate. The photoresist layer is selectively exposed to actinic radiation. After selectively exposing the photoresist layer to actinic radiation, the semiconductor substrate is stored in a semiconductor substrate container under an ambient of extreme dry clean air or inert gas. After the storing the semiconductor substrate, a first heating of the photoresist layer is performed. In an embodiment, the first heating of the photoresist layer is at a temperature of 50° C. to 160° C. In an embodiment, the photoresist layer comprises a metal-containing photoresist. In an embodiment, the actinic radiation is ultraviolet, deep ultraviolet, extreme ultraviolet, electron beam, or ion beam. In an embodiment, the extreme dry clean air or the inert gas contains less than 1 ppb impurity. In an embodiment, the semiconductor substrate container is a front opening unified pod. In an embodiment, the method includes purging the semiconductor substrate container with the extreme dry clean air or the inert gas after the semiconductor substrate is placed in the semiconductor substrate container and sealing the semiconductor substrate container after the purging. In an embodiment, the method includes monitoring a moisture content of a gas exiting the semiconductor substrate container during purging. In an embodiment, the method includes stopping the purging and sealing the semiconductor substrate container when a relative humidity of the gas exiting the semiconductor substrate container is below a threshold relative humidity. In an embodiment, the threshold relative humidity is between 0.1% to 1% relative humidity. In an embodiment, a duration of the storing is between 1 minute and 96 hours. In an embodiment, the method includes developing the selectively exposed photoresist layer after the first heating. In an embodiment, the method includes forming a first protective layer over the semiconductor substrate before forming the photoresist layer, removing the first protective layer after forming the photoresist layer, and forming a second protective layer over the semiconductor substrate after the first heating.

According to some embodiments of the present disclosure, a method for manufacturing a semiconductor device includes forming a photoresist layer over a semiconductor substrate. The photoresist layer is selectively exposed to extreme ultraviolet radiation. After selectively exposing the photoresist layer to extreme ultraviolet radiation, the semiconductor substrate is stored in a semiconductor substrate container under an ambient of extreme dry clean air or an inert gas with a relative humidity between 0.1% to 1%. After the storing the semiconductor substrate for a period between 12 hours and 48 hours, a post-exposure bake of the photoresist layer is performed.

According to some embodiments of the present disclosure, a storage system for storing photoresist coated semiconductor substrates includes a semiconductor substrate container configured to store a plurality of semiconductor substrates, a gas inlet, a gas outlet, and a sensor. The sensor is coupled to the gas outlet and configured to measure a humidity of a gas exiting the semiconductor substrate container through the gas outlet, and a source of an inert gas or an extreme clean dry air connected via a gas purifier to the gas inlet. A controller is configured to control the gas purifier and the sensor to purge a humidity inside the semiconductor substrate container with the inert gas or the extreme clean dry air such that a relative humidity of the gas exiting the semiconductor substrate container is below a threshold relative humidity. In an embodiment, the storage system the semiconductor substrate container is a front opening unified pod. In an embodiment, the threshold relative humidity is between 0.1% relative humidity to 1% relative humidity. In an embodiment, the storage system includes a gas purifier connected in line with the gas inlet. In an embodiment, the gas purifier is an automatically regenerable purifier. In an embodiment, the gas purifier is configured to provide purified gas containing less than 1 ppb impurities and less than 1% relative humidity.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, comprising:
   forming a first protective layer around edges of a semiconductor substrate;
   forming a photoresist layer over the semiconductor substrate;
   removing the first protective layer after forming the photoresist layer;
   selectively exposing the photoresist layer to actinic radiation;
   after the selectively exposing the photoresist layer to actinic radiation, storing the semiconductor substrate in a semiconductor substrate container under an ambient of an extreme dry clean air or an inert gas, wherein a duration of the storing is between 24 hours and 96 hours; and
   after the storing the semiconductor substrate, performing a first heating of the photoresist layer.

2. The method according to claim 1, wherein the first heating of the photoresist layer is at a temperature of 50° C. to 170° C.

3. The method according to claim 1, wherein the photoresist layer comprises a metal-containing photoresist.

4. The method according to claim 1, wherein the actinic radiation is ultraviolet, deep ultraviolet, extreme ultraviolet, electron beam, or ion beam.

5. The method according to claim 1, wherein the extreme dry clean air or the inert gas contains less than 1 part per billion (ppb) impurity.

6. The method according to claim 1, wherein the semiconductor substrate container is a front opening unified pod.

7. The method according to claim 1, further comprising:
purging the semiconductor substrate container with the extreme dry clean air or the inert gas after the semiconductor substrate is placed in the semiconductor substrate container; and
sealing the semiconductor substrate container after the purging.

8. The method according to claim 7, further comprising monitoring a moisture content of a gas exiting the semiconductor substrate container during purging.

9. The method according to claim 8, further comprising stopping the purging and sealing the semiconductor substrate container when a relative humidity of the gas exiting the semiconductor substrate container is below a threshold relative humidity.

10. The method according to claim 9, wherein the threshold relative humidity is between 0.1% to 1% relative humidity.

11. The method according to claim 1, wherein the duration of the storing is between 24 hours and 48 hours.

12. The method according to claim 1, further comprising developing the selectively exposed photoresist layer after the first heating.

13. The method according to claim 1, further comprising:
forming a second protective layer around the edges of the semiconductor substrate after the first heating.

14. A method for manufacturing a semiconductor device, comprising:
forming a protective layer around edges of a semiconductor substrate;
forming a photoresist layer over the semiconductor substrate;
removing the protective layer after forming the photoresist layer;
selectively exposing the photoresist layer to extreme ultraviolet radiation;
after selectively exposing the photoresist layer to extreme ultraviolet radiation, storing the semiconductor substrate in a semiconductor substrate container under an ambient of an extreme dry clean air or an inert gas with a relative humidity between 0.1% to 1%, wherein a duration of the storing is between 24 hours and 96 hours; and
after the storing the semiconductor substrate for the duration between 24 hours and 96 hours, performing a post-exposure bake of the photoresist layer.

15. A method for manufacturing a semiconductor device, comprising:
forming a protective layer around edges of a semiconductor substrate;
forming a photoresist layer with a metal containing photoresist material over the semiconductor substrate;
removing the protective layer after forming the photoresist layer;
exposing the photoresist layer to ultraviolet radiation;
after the exposing, storing the semiconductor substrate in a semiconductor substrate container for a period between 24 hour and 96 hours in an ambient of an extreme dry clean air or an inert gas with a relative humidity that is below a threshold relative humidity;
after the storing, performing a post-exposure bake of the photoresist layer; and
developing the exposed photoresist layer after the post-exposure bake.

16. The method of claim 15, wherein the threshold relative humidity is between 0.1% relative humidity to 1% relative humidity.

17. The method of claim 15, wherein the semiconductor substrate container is a front opening unified pod.

18. The method of claim 15, wherein the extreme dry clean air or the inert gas is provided through a gas purifier to the semiconductor substrate container, and wherein the gas purifier maintains less than 1 ppb impurities in the extreme dry clean air or the inert gas.

19. The method of claim 18, wherein the gas purifier is an automatically regenerable purifier.

20. The method of claim 15, wherein after the developing, a variation of a mean critical dimension (CD) value of the photoresist layer that has been stored in the semiconductor substrate container in the ambient with the relative humidity for a duration of 48 hours is within 1% of an initial mean CD value.

* * * * *